(12) United States Patent
Ueda (10) Patent No.: US 9,058,884 B2
(45) Date of Patent: Jun. 16, 2015

(54) DRIVING METHOD OF SEMICONDUCTOR STORAGE DEVICE AND SEMICONDUCTOR STORAGE DEVICE

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 13/601,492

(22) Filed: Aug. 31, 2012

(65) Prior Publication Data

US 2013/0250653 A1 Sep. 26, 2013

(30) Foreign Application Priority Data

Mar. 21, 2012 (JP) .................................. 2012-064458

(51) Int. Cl.

| G11C 11/00 | (2006.01) |
|---|---|
| G11C 11/14 | (2006.01) |
| G11C 11/15 | (2006.01) |
| G11C 11/16 | (2006.01) |

(52) U.S. Cl.
CPC ...................................... *G11C 11/16* (2013.01)

(58) Field of Classification Search
USPC ........................... 365/148, 158, 163, 171, 173
See application file for complete search history.

(56) References Cited

U.S. PATENT DOCUMENTS

| 5,361,227 A | 11/1994 | Tanaka et al. |
|---|---|---|
| 5,546,351 A | 8/1996 | Tanaka et al. |
| 5,615,165 A | 3/1997 | Tanaka et al. |
| 5,724,300 A | 3/1998 | Tanaka et al. |
| 5,793,696 A | 8/1998 | Tanaka et al. |
| 5,818,791 A | 10/1998 | Tanaka et al. |
| 5,909,399 A | 6/1999 | Tanaka et al. |
| 6,172,911 B1 | 1/2001 | Tanaka et al. |
| 6,188,615 B1 | 2/2001 | Perner et al. |
| 6,317,376 B1 | 11/2001 | Tran et al. |

(Continued)

FOREIGN PATENT DOCUMENTS

| JP | H6-76586 | 3/1994 |
|---|---|---|
| JP | 2001-184857 A | 7/2001 |

(Continued)

OTHER PUBLICATIONS

G. Jeong et al. "A 0.24-µm 2.0-V 1T1MTJ 16-kb Nonvolatile Magnetoresistance RAM With Self-Reference Sensing Scheme" IEEE Journal of solid-state circuits, vol. 38, No. 11, Nov. 2003, pp. 1906-1910.

(Continued)

*Primary Examiner* — Trong Phan
(74) *Attorney, Agent, or Firm* — Knobbe, Martens, Olson & Bear, LLP (57) ABSTRACT

A memory includes storage elements, a signal holding part and a sense amplifier. A driving-method includes a read operation for reading target data stored in a first storage element of the storage elements. In the read operation, the signal holding part holds a first voltage according to the target data. First sample data of a first logic is written to the first storage element. The signal holding part holds a second voltage according to the first sample data. Second sample data of a second logic opposite to the first logic is written to the first storage element. The signal holding part holds a third voltage according to the second sample data. The sense amplifier compares a read signal based on the first voltage with a reference signal generated based on the second and third voltages to detect a logic of the target data stored in the first storage element.

14 Claims, 7 Drawing Sheets

(56) References Cited

U.S. PATENT DOCUMENTS

| | | |
|---|---|---|
| 6,597,601 B2 | 7/2003 | Ooishi |
| 6,649,953 B2 | 11/2003 | Cha |
| 6,760,266 B2 | 7/2004 | Garni et al. |
| 6,781,895 B1 | 8/2004 | Tanaka et al. |
| 6,788,571 B2 | 9/2004 | Ooishi et al. |
| 6,804,144 B2 | 10/2004 | Iwata |
| 6,842,366 B2 | 1/2005 | Tanizaki et al. |
| 6,967,892 B2 | 11/2005 | Tanaka et al. |
| 7,139,201 B2 | 11/2006 | Tanaka et al. |
| 7,920,405 B2 * | 4/2011 | Kang et al. .............. 365/148 |
| 8,493,776 B1 * | 7/2013 | Yu et al. .................. 365/158 |
| 8,542,525 B2 * | 9/2013 | Berger et al. ............ 365/158 |
| 8,687,412 B2 * | 4/2014 | Chih et al. ............... 365/158 |
| 2009/0323402 A1 | 12/2009 | Li et al. |

FOREIGN PATENT DOCUMENTS

| | | |
|---|---|---|
| JP | 2002-032983 A | 1/2002 |
| JP | 2003-151262 A | 5/2003 |
| JP | 2003-178573 | 6/2003 |
| JP | 2003-346473 A | 12/2003 |
| JP | 2004-103104 | 4/2004 |

OTHER PUBLICATIONS

Japanese Office Action for Patent Application 2012-064458, to which this case claims priority, dated Apr. 25, 2014, 6 pages including translation.

Song et al.; "A 31ns Random Cycle VCAT-Based $4F^2$ DRAM With Manufacturability and Enhanced Cell Efficiency." IEEE Journal of Solid-State Circuits, vol. No. 4, Apr. 2010. pp. 880-888.

* cited by examiner

DRIVING METHOD OF SEMICONDUCTOR STORAGE DEVICE AND SEMICONDUCTOR STORAGE DEVICE

CROSS REFERENCE TO RELATED APPLICATIONS

This application is based upon and claims the benefit of priority from the prior Japanese Patent Application No. 2012-64458, filed on Mar. 21, 2012, the entire contents of which are incorporated herein by reference.

FIELD

The embodiments of the present invention relate to manufacturing method of semiconductor storage device and semiconductor storage device.

BACKGROUND

There is known a magnetic random access memory (MRAM) as one type of resistive random access memories. A resistance change ratio of the MRAM using STT (Spin Transfer Torque)-type MTJ elements becomes lower when the MRAM is downscaled. In this case, since a read signal difference becomes smaller, it is necessary for the MRAM to detect data with high accuracy when reading the data. In order to read the data with high accuracy, reference data is preferably closer to the intermediate between data "1" and data "0". However, in the downscaled MRAM, it is disadvantageously difficult to set the reference data to be closer to the intermediate between the data "1" and the data "0".

DETAILED DESCRIPTION

In a driving method of a semiconductor storage device according to the present embodiment, the semiconductor storage device includes a plurality of resistance change storage elements, a signal holding part configured to hold a plurality of voltages according to data stored in the storage elements, and a sense amplifier configured to detect the data stored in the storage elements based on the voltages held in the signal holding part. The driving method includes a read operation for reading target data stored in a first storage element selected from among the storage elements. In the read operation, the signal holding part holds a first voltage according to the target data. First sample data of a first logic is written to the first storage element. The signal holding part holds a second voltage according to the first sample data. Second sample data of a second logic opposite to the first logic is written to the first storage element. The signal holding part holds a third voltage according to the second sample data. The sense amplifier compares a read signal based on the first voltage with a reference signal generated based on the second and third voltages in order to detect a logic of the target data stored in the first storage element.

Embodiments will now be explained with reference to the accompanying drawings. The present invention is not limited to the embodiments.

Figure 1:
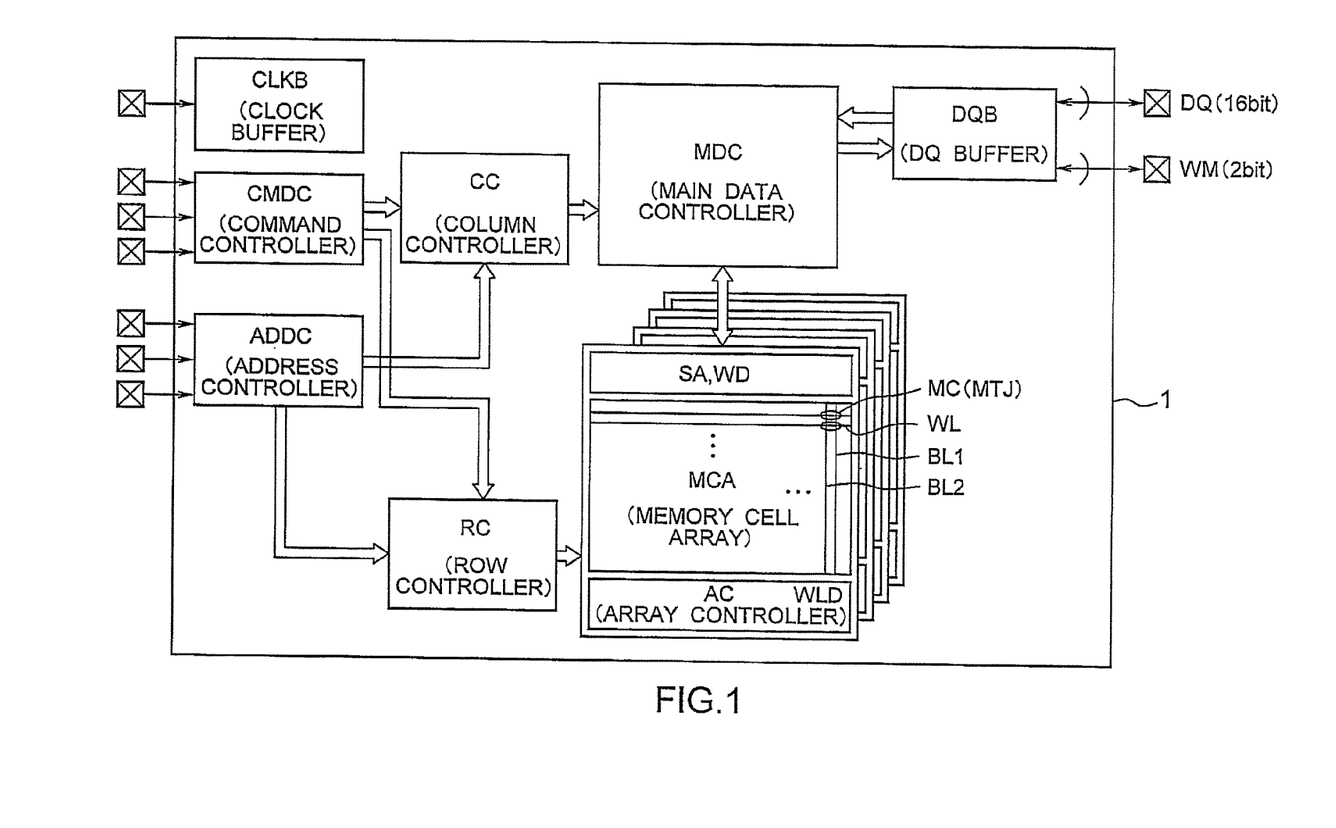
FIG. 1 is a block diagram showing a memory chip of a magnetic random access memory according to an embodiment.

FIG. 1 is a block diagram showing a memory chip of a magnetic random access memory (hereinafter, "MRAM") according to a present embodiment. The present embodiment is not limited to the MRAM but applicable to a memory (such as a PCRAM or an ReRAM) using resistance change elements other than the MRAM.

The MRAM according to the present embodiment includes memory cell arrays MCA, sense amplifiers SA, a main data controller MDC, a DQ buffer DQB, a column controller CC, a row controller RC, a clock buffer CLKB, a command controller CMDC, an address controller ADDC, and array controllers AC.

Each of the memory cell arrays MCA includes a plurality of memory cells MC that are arranged, for example, two-dimensionally in a matrix. The memory cells MC are arranged to correspond to intersections between a bit line pair (BL1 and BL2, for example) and word lines WL, respectively. That is, one end of each of the memory cells MC is connected to the BL1 that is one of the bit line pair and the other end thereof is connected to the BL2 that is the other of the bit line pair.

The bit line pair BL1 and BL2 extends in a column direction. The word lines WL extend in a row direction orthogonal to the column direction.

Each of the sense amplifiers SA is connected to the memory cells MC via the bit line BL1, for example, and functions to detect data stored in each of the memory cells MC. A write driver WD is connected to the memory cells MC via the bit lines BL1 and BL2, for example, and functions to write data to each of the memory cells MC.

The main data controller MDC transfers data received from the DQ buffer DQB to the write driver WD so as to write the data to a desired column under control of the column controller CC. Alternatively, the main data controller MDC transfers data read from a desired column to the DQ buffer DQB under control of the column controller CC.

The DQ buffer DQB that serves as a data buffer temporarily holds read data detected by each of the sense amplifiers SA and outputs the read data to the outside of a memory chip 1. Alternatively, the DQ buffer DQB temporarily holds write data received via a DQ pad DQ and transfers the write data to the write driver WD.

The column controller CC controls the sense amplifiers SA or the write driver WD to operate so as to selectively drive one of the bit lines BL in a desired column in response to a column address.

The row controller RC controls a word line driver WLD to operate so as to selectively drive a desired word line WL in response to a row address.

The clock buffer CLKB receives a clock signal for determining timing of operations of the entire memory chip 1. The command controller CMD receives commands indicating various operations such as a data read operation and a data write operation, and controls the column controller CC and the row controller RC in response to those commands, respectively.

The address controller ADDC receives row addresses, column addresses, and the like, decodes these addresses, and transmits these addresses to the column controller CC and the row controller RC, respectively.

Each of the array controllers AC controls the entirety of each of the corresponding memory cell arrays MCA.

Figure 2:
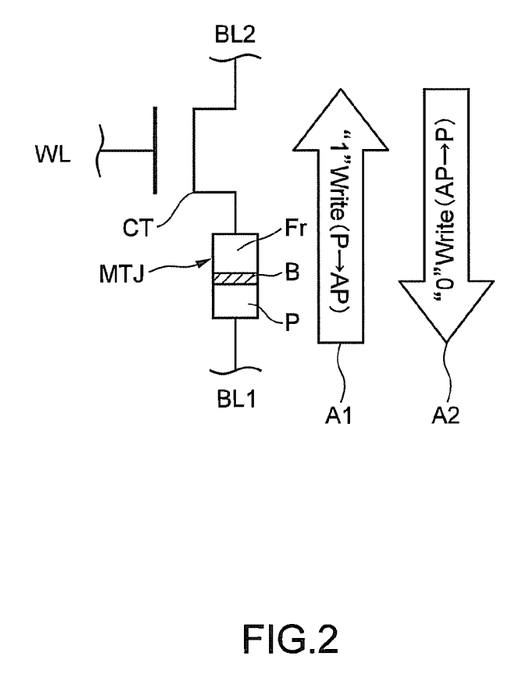
FIG. 2 is an explanatory diagram showing a configuration of one of the memory cells MC.

FIG. 2 is an explanatory diagram showing a configuration of one of the memory cells MC. Each memory cell MC includes a magnetic tunnel junction (MTJ) element and a cell transistor CT. The MTJ element is an STT-MTJ element. The MTJ element and the cell transistor CT are connected in series between the bit lines BL1 and BL2. In the memory cell MC, the cell transistor CT is arranged near the bit line BL2 and the MTJ element is arranged near the bit line BL1. A gate of the cell transistor CT is connected to one word line WL.

The STT-MTJ element that uses the TMR (tunneling magnetoresistive) effect has a stacking structure including two ferromagnetic layers and a nonmagnetic layer (an insulating thin film) sandwiched between the two ferromagnetic layers. The STT-MTJ element stores digital data according to a change in a magnetic resistance due to the spin-polarized tunneling effect. The MTJ element can be made into a low resistance state and a high resistance state depending on magnetization arrangements of the two ferromagnetic layers. For example, if it is defined that the low resistance state is data "0" and that the high resistance state is data "1", one-bit data can be recorded in the MTJ element. Needless to say, it can be defined that the low resistance state is the data "1" and that the high resistance state is the data "0". For example, as shown in FIG. 2, the MTJ element is formed by sequentially stacking a pinned layer P, a tunnel barrier layer B, and a recording layer Fr. The pinned layer P and the recording layer Fr are made of a ferromagnetic material and the tunnel barrier layer B is made of an insulating film. The pinned layer P is a layer having a fixed magnetization direction, the recording layer Fr has a variable magnetization direction, and the MTJ element stores data depending on the magnetization directions of the pinned layer P and the recording layer Fr.

When a current equal to or higher than an inversion threshold current flows in an arrow A1 direction during the write operation, then the magnetization direction of the recording layer Fr becomes anti-parallel (Parallel P to Anti-Parallel AP) to that of the pinned layer P, and the MTJ element is made into the high resistance state (data "1"). When the current equal to or higher than the inversion threshold current flows in an arrow A2 direction during the write operation, the magnetization direction of the recording layer Fr becomes parallel (Anti-Parallel AP to Parallel P) to that of the pinned layer P, and the MTJ element is made into the low resistance state (data "0"). In this way, different data can be written to the MTJ element depending on a current direction.

In the MRAM, during the data read operation, each of the sense amplifiers SA detects a resistance difference among the memory cells MC by supplying a current (a cell current) to the memory cells MC. At this time, the cell current is a current lower than the inversion threshold current used during the data write operation. A read current is, therefore, inevitably quite low.

Examples of the sense amplifiers SA include a constant-current-type sense amplifier and a constant-voltage-clamp-type sense amplifier, and the like. If the constant-current-type sense amplifiers are used, a voltage difference (a signal difference) between the data "0" and the data "1" is several tens of millivolts (mV). If the constant-voltage-clamp-type sense amplifiers are used, a current ratio (a signal ratio) of the data "0" to the data "1" is several microamperes ($\mu A$).

It is necessary to detect data with high accuracy so as to detect such a subtle signal difference. For the highly accurate data detection, it is necessary to use appropriate reference data that is set near a center between the data "1" and the data "0". To generate such appropriate reference data, a configuration shown in FIG. 3 is used according to the present embodiment.

Figure 3:
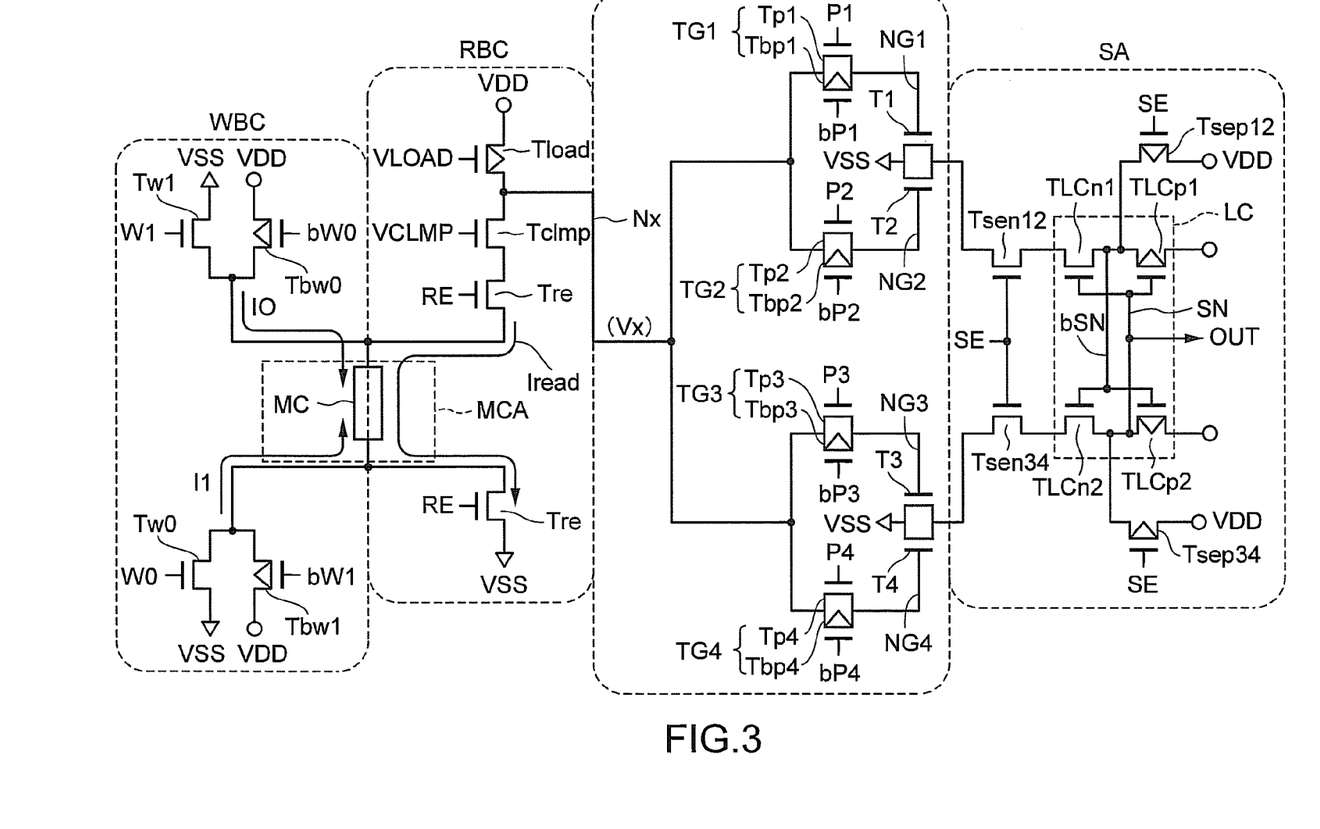
FIG. 3 is a circuit diagram showing a schematic configuration of the MRAM according to the present embodiment.

FIG. 3 is a circuit diagram showing a schematic configuration of the MRAM according to the present embodiment. FIG. 3 shows the memory cell MC selected within one memory cell array MCA and circuits connected to the selected memory cell MC during the data read operation. The other unselected memory cells MC, the word lines WL, and the bit lines BL are not shown in FIG. 3.

The MRAM according to the present embodiment includes the memory cell arrays MCA, a write bias circuit WBC, a read bias circuit RBC, a signal holding circuit SSC, and the sense amplifiers SA.

The write bias circuit WBC includes n-transistors Tw0 and Tw1 and p-transistors Tbw0 and Tbw1. The transistors Tw0 and Tbw0 are transistors that become conductive when the data "0" is written to the selected memory cell MC. Gate signals W0 and bW0 of the transistors Tw0 and Tbw0 are complementary to each other, and the transistors Tw0 and Tbw0 are driven simultaneously in response to the gate signals W0 and bW0, respectively. The transistors Tw1 and Tbw1 are transistors that become conductive when the data "1" is written to the selected memory cell MC. Gate signals W1 and bW1 of the transistors Tw1 and Tbw1 are complementary to each other, and the transistors Tw1 and Tbw1 are driven simultaneously in response to the gate signals W1 and bW1, respectively.

When the transistors Tw0 and Tbw0 are conductive, a current I0 flows to the selected memory cell MC and the data "0" is written to the selected memory cell MC. When the transistors Tw1 and Tbw1 are conductive, a current I1 flows to the selected memory cell MC and the data "1" is written to the selected memory cell MC.

The read bias circuit RBC includes two n-transistors Tre, an n-transistor Tclmp and a p-transistor Tload. The transistor Tre is a transistor that becomes conductive during the data read operation. The transistor Tre is controlled by a read enable signal RE. The transistor Tclmp is a transistor that determines a voltage to be applied to the selected memory cell MC when the data is read. The transistor Tclmp is controlled by a clamp signal VCLMP to become conductive during the data read operation. The transistor Tload is a transistor that determines a voltage Vx of a node Nx. The transistor Tload is controlled by a load signal VLOAD to become conductive during the data read operation.

The node Nx between the transistors Tload and Tclmp is connected to the signal holding circuit SSC. The voltage Vx of the node Nx is transmitted to the signal holding circuit SSC as a signal in response to the data stored in the selected memory cell MC.

During the data read operation, the read bias circuit RBC applies a predetermined voltage to the selected memory cell MC and carries a current Iread to the selected memory cell MC. At this time, the read bias circuit RBC applies the voltage Vx of the node Nx to the signal holding circuit SSC.

The signal holding circuit SSC includes n-transistors Tp1 to Tp4, p-transistors Tbp1 to Tbp4, and n-transistors (hereinafter, also "first to fourth transistors") T1 to T4. The transistors Tp1 and Tbp1 are connected to each other in parallel. The transistors Tp1 and Tbp1 thereby function as a first transfer gate TG1 that transfers the voltage Vx to a gate electrode (a gate node) NG1 of the transistor T1. The transistors Tp2 and Tbp2 are connected to each other in parallel. The transistors Tp2 and Tbp2 thereby function as a second transfer gate TG2 that transfers the voltage Vx to a gate electrode (a gate node) NG2 of the transistor T2. The transistors Tp3 and Tbp3 are connected to each other in parallel. The transistors Tp3 and Tbp3 thereby function as a third transfer gate TG3 that transfers the voltage Vx to a gate electrode (a gate node) NG3 of the transistor T3. The transistors Tp4 and Tbp4 are connected to each other in parallel. The transistors Tp4 and Tbp4 thereby function as a fourth transfer gate TG4 that transfers the voltage Vx to a gate electrode (a gate node) NG4 of the transistor T4.

Gate signals P1 and bP1 are complementary to each other, and the first transfer gate TG1 is driven in response to the gate signals P1 and bP1. Gate signals P2 and bP2 are complementary to each other, and the second transfer gate TG2 is driven in response to the gate signals P2 and bP2. Gate signals P3 and bP3 are complementary to each other, and the third transfer gate TG3 is driven in response to the gate signals P3 and bP3. Gate signals P4 and bP4 are complementary to each other, and the fourth transfer gate TG4 is driven in response to the gate signals P4 and bP4.

The gate electrode NG1 of the first transistor T1 is connected to the node Nx via the first transfer gate TG1. The gate electrode NG2 of the second transistor T2 is connected to the node Nx via the second transfer gate TG2. The first transistor T1 and the second transistor T2 are connected to each other in parallel.

Drains of the first transistor T1 and the second transistor T2 are connected to a sense node bSN of one of the sense amplifiers SA via a transistor Tsen12 and the like.

The gate electrode NG3 of the third transistor T3 is connected to the node Nx via the third transfer gate TG3. The gate electrode NG4 of the fourth transistor T4 is connected to the node Nx via the fourth transfer gate TG4. The third transistor T3 and the fourth transistor T4 are connected to each other in parallel.

Drains of the third transistor T3 and the fourth transistor T4 are connected to a sense node SN of one of the sense amplifiers SA via a transistor Tsen34 and the like.

The signal holding circuit SSC configured as described above can hold the voltage Vx of the node Nx in one of the gate nodes NG1 to NG4 by controlling the transfer gates TG1 to TG4.

Each of the sense amplifiers SA includes the n-transistors Tsen12 and Tsen34, p-transistors Tsep12 and Tsep34, and a latch circuit LC.

The transistor Tsen12 is connected between the drains of the transistors T1, T2 of the signal holding circuit SSC and the latch circuit LC. The transistor Tsen34 is connected between the drains of the transistors T3, T4 of the signal holding circuit SSC and the latch circuit LC. The transistors Tsen12 and Tsen34 commonly receive a sense enable signal SE, and are driven simultaneously in response to the sense enable signal SE.

The latch circuit LC includes n-transistors TLCn1 and TLCn2 and p-transistors TLCp1 and TLCp2.

The transistors TLCn1 and TLCp1 are directly connected between a power supply voltage VDD and the transistor Tsen12. Gate electrodes of the transistors TLCn1 and TLCp1 are commonly connected to the sense node SN that is present between the transistors TLCn2 and TLCp2.

The transistors TLCn2 and TLCp2 are directly connected between the power supply voltage VDD and the transistor Tsen34. Gate electrodes of the transistors TLCn2 and TLCp2 are commonly connected to the sense node bSN that is present between the transistors TLCn1 and TLCp1.

In this way, the gate electrodes of the transistors TLCn1 and TLCp1 are cross-coupled to those of the transistors TLCn2 and TLCp2.

The sense node bSN between the transistors TLCn1 and TLCp1 is connected to the power supply voltage VDD via the transistor Tsep12. The sense node SN between the transistors TLCn2 and TLCp2 is connected to the power supply voltage VDD via the transistor Tsep34.

The sense amplifier SA configured as described above can amplify a voltage difference between a voltage obtained via the transistor Tsen12 and a voltage obtained via the transistor Tsen34, and latch the voltage difference to the sense nodes SN and bSN of the latch circuit LC. The sense amplifier SA outputs the voltage held in the sense node SN as a detection result OUT. VSS is a ground voltage, for example.

Operations of the MRAM according to the present embodiment are explained next.

Figure 4:
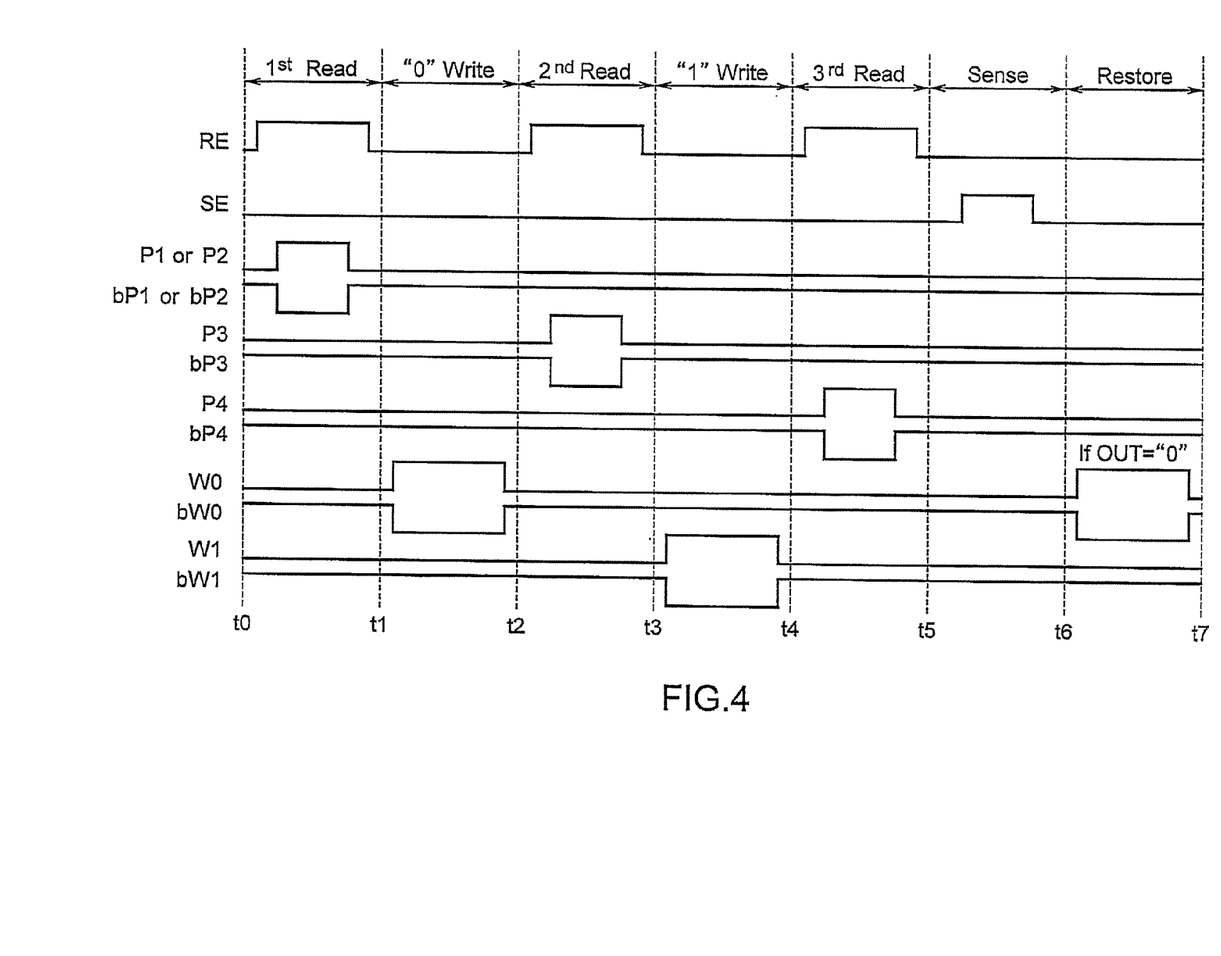
FIG. 4 is a timing diagram showing the data read operation performed by the MRAM according to the present embodiment.
Figure 5:
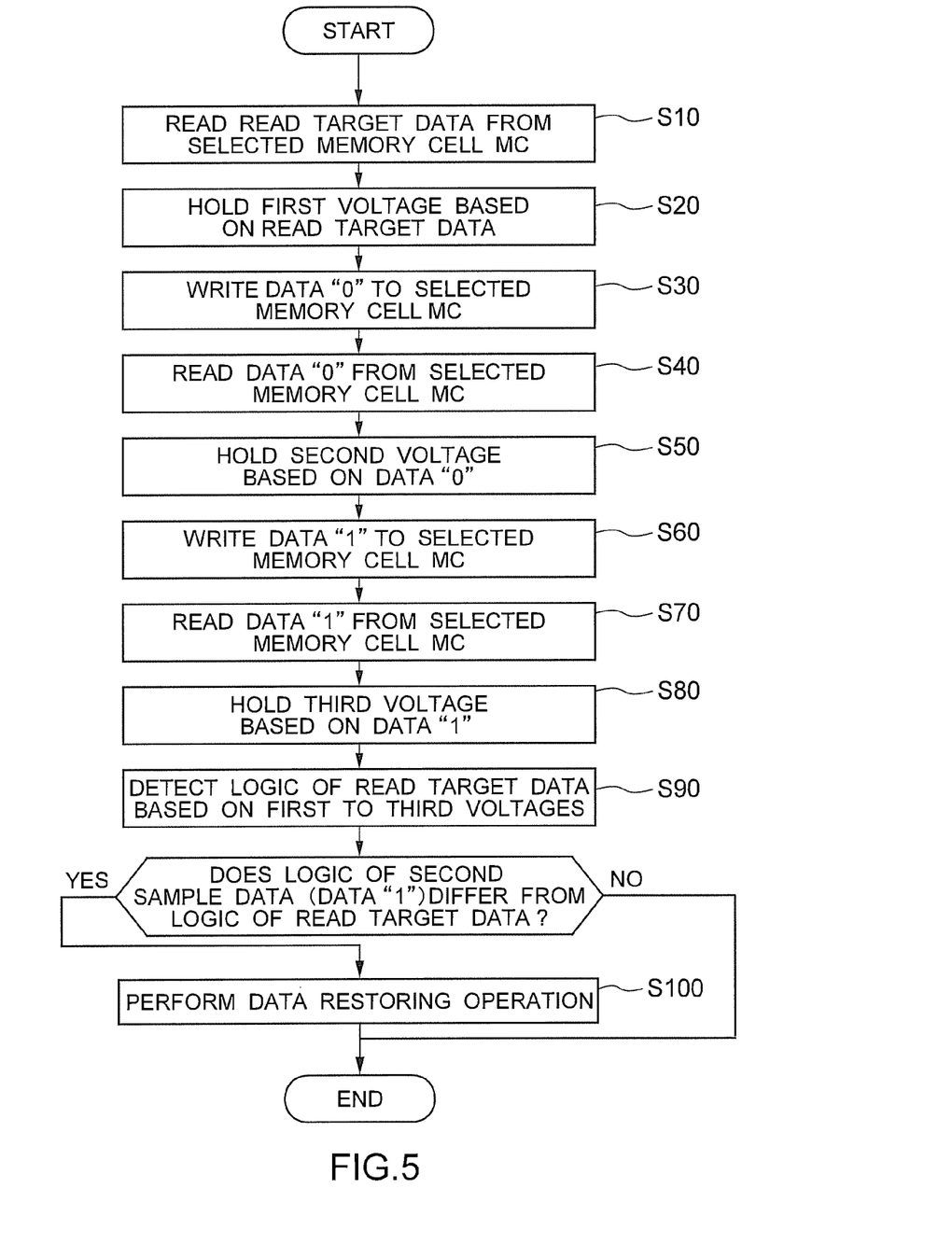
FIG. 5 is a flowchart showing the data read operation performed by the MRAM according to the present embodiment.

FIG. 4 is a timing diagram showing the data read operation performed by the MRAM according to the present embodiment. FIG. 5 is a flowchart showing the data read operation performed by the MRAM according to the present embodiment. The selected memory cell MC that serves as a first storage element stores data of a certain logic as read target data. The MRAM detects the read target data stored in the selected memory cell MC according to a data read sequence shown in FIG. 4. Note that the transistors Tload and Tclmp shown in FIG. 3 are kept conductive during the data read operation.

First, from t0 to t1, the MRAM performs a first read operation (S10). During the first read operation, the signal holding circuit SSC holds a first voltage based on the read target data stored in the selected memory cell MC (S20).

More specifically, the read enable signal RE is activated to logical high. The read bias circuit RBC shown in FIG. 3 thereby carries a read current Iread to the selected memory cell MC. Furthermore, the gate signals P1 and P2 are activated to logical high. The gate signals bP1 and bP2 are activated to logical low, accordingly. The first and second transfer gates TG1 and TG2 shown in FIG. 3 thereby become conductive. The first voltage according to the read target data is transmitted to the gate nodes NG1 and NG2 via the first and second transfer gates TG1 and TG2, respectively.

The gate signals P1 and P2 are then deactivated to logical low, and the gate signals bP1 and bP2 are deactivated to logical high. The first and second transfer gates TG1 and TG2 thereby become nonconductive. The first voltage is thereby held in the gate nodes NG1 and NG2.

Next, from t1 to t2, the MRAM performs a data write operation (first write operation) for writing the data "0" that serves as first sample data (S30). During the data "0" write operation, the write bias circuit WBC writes the data "0" to the selected memory cell MC.

More specifically, the gate signal W0 of the transistor Tw0 shown in FIG. 3 is activated to logical high, and the gate signal bW0 of the transistor Tbw0 shown in FIG. 3 is activated to logical low. The write bias circuit WBC shown in FIG. 3 thereby carries the current I0 to the selected memory cell MC and writes the data "0" to the selected memory cell MC.

At this time, the write bias circuit WBC overwrites the data "0" on the read target data in the selected memory cell MC. However, no problems occur because information on the read target data is held in the signal holding circuit SSC as the first voltage.

From t2 to t3, the MRAM performs a second read operation (S40). During the second read operation, the signal holding circuit SSC holds a second voltage based on the data "0" stored in the selected memory cell MC (S50).

More specifically, the read enable signal RE is activated to logical high. The read bias circuit RBC thereby carries the read current Iread to the selected memory cell MC. Furthermore, the gate signal P3 is activated to logical high. The gate signal bP3 is activated to logical low, accordingly. The third transfer gate TG3 shown in FIG. 3 thereby becomes conductive. The second voltage according to the data "0" is transmitted to the gate node NG3 via the third gate transfer gate TG3.

The gate signal P3 is deactivated to logical low and the gate signal bP3 is deactivated to logical high. The third transfer gate TG3 thereby becomes nonconductive. The second voltage is thereby held in the gate node NG3.

From t3 to t4, the MRAM performs a data write operation (second write operation) for writing the data "1" that serves as second sample data (S60). During the data "1" write operation, the write bias circuit WBC writes the data "1" to the selected memory cell MC.

More specifically, the gate signal W1 of the transistor Tw1 shown in FIG. 3 is activated to logical high, and the gate signal bW1 of the transistor Tbw1 shown in FIG. 3 is activated to logical high. The write bias circuit WBC shown in FIG. 3 thereby carries the current I1 to the selected memory cell MC and writes the data "1" to the selected memory cell MC.

At this time, the write bias circuit WBC overwrites the data "1" on the data "0" in the selected memory cell MC. However, no problems occur because information on the data "0" is held in the signal holding circuit SSC as the second voltage.

From t4 to t5, the MRAM performs a third data read operation (S70). During the third data read operation, the signal holding circuit SSC holds a third voltage based on the data "1" stored in the selected memory cell MC (S80).

More specifically, the read enable signal RE is activated to logical high. The read bias circuit RBC thereby carries the read current Iread to the selected memory cell MC. Furthermore, the gate signal P4 is activated to logical high. The gate signal bP4 is activated to logical low, accordingly. The fourth transfer gate TG4 shown in FIG. 3 thereby becomes conductive. The third voltage according to the data "1" is transmitted to the gate node NG4 via the fourth transfer gate TG4.

The gate signal P4 is deactivated to logical low and the gate signal bP4 is deactivated to logical high. The fourth transfer gate TG4 thereby becomes nonconductive. The third voltage is thereby held in the gate node NG4.

At this time, the signal holding circuit SSC holds the first voltage corresponding to the read target data in the gate nodes NG1 and NG2, the second voltage corresponding to the data "0" in the gate node NG3, and the third voltage corresponding to the data "1" in the gate node NG4. Therefore, the first voltage is applied to the gate electrodes (NG1 and NG2) of the first and second transistors T1 and T2. The second voltage is applied to the gate electrode (NG3) of the third transistor T3. The third voltage is applied to the gate electrode (NG4) of the fourth transistor T4.

Figure 6A:
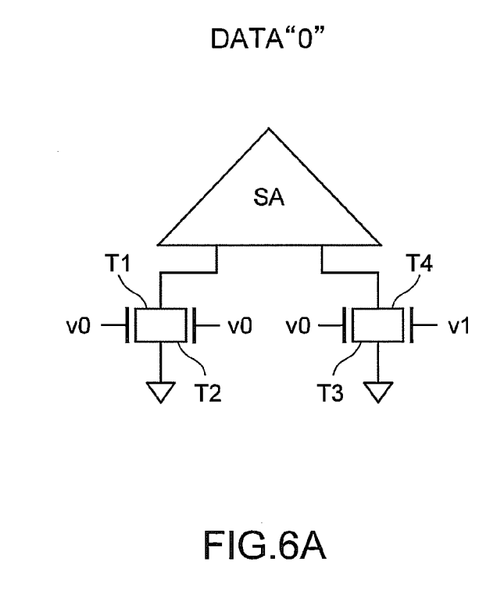
FIGS. 6A and 6B are schematic diagrams of the signal holding circuit SSC and the sense amplifier SA.
Figure 6B:
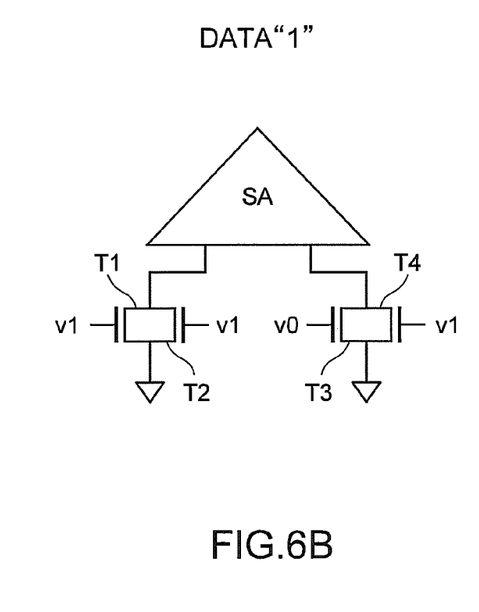

FIGS. 6A and 6B simply show states of the signal holding circuit SSC that is holding the first to third voltages and those of the sense amplifier SA.

FIG. 6A is a schematic diagram of the signal holding circuit SSC and the sense amplifier SA when the read target data is the data "0". FIG. 6B is a schematic diagram of the signal holding circuit SSC and the sense amplifier SA when the read target data is the data "1". Symbol V0 denotes a voltage held in the gate nodes NG1 to NG4 when the data "0" is stored in the selected memory cell MC. Symbol V1 denotes a voltage held in the gate nodes NG1 to NG4 when the data "1" is stored in the selected memory cell MC. As shown in FIG. 6A, when the read target data is the data "0", the voltage V0 is applied to the gate electrodes (NG1 and NG2) of the first and second transistors T1 and T2 as the first voltage. On the other hand, as shown in FIG. 6B, when the read target data is the data "1", the voltage V1 is applied to the gate electrodes (NG1, and NG2) of the first and second transistors T1 and T2 as the first voltage. The voltage V0 is applied to the gate electrode (NG3) of the third transistor T3 as the second voltage in either a case shown in FIG. 6A or that shown in FIG. 6B. The voltage V1 is applied to the gate electrode (NG4) of the fourth transistor T4 as the third voltage in either the case shown in FIG. 6A or that shown in FIG. 6B.

In this way, conductive states of the third and fourth transistors T3 and T4 do not change depending on the logic of the read target data; however, conductive states of the first and second transistors T1 and T2 change depending on the logic of the read target data.

Therefore, at the time point of t5 shown in FIG. 4, the first and second transistors T1 and T2 are in the conductive states (or nonconductive states) according to the first voltage that corresponds to the read target data. Therefore, the first and second transistors T1 and T2 can apply a read signal to the sense amplifier SA based on the first voltage.

The third transistor T3 is in the conductive state (or the nonconductive state) according to the second voltage that corresponds to the data "0". The fourth transistor T4 is in the conductive state (or the nonconductive state) according to the third voltage that corresponds to the data "1".

Herein, because the third and fourth transistors T3 and T4 are connected in parallel, the conductive states of the third and fourth transistors T3 and T4 are an intermediate conductive state that corresponds to intermediate data between the data "0" and the data "1". Therefore, the third and fourth transistors T3 and T4 can apply a reference signal that is in between the second and third voltages to the sense amplifier SA. The reference signal is an intermediate signal that is obtained according to the intermediate conductive states of the third and fourth transistors T3 and T4 by an intermediate voltage between the second and third voltages.

As shown in FIG. 4, from t5 to t6, the sense amplifier SA detects the logic of the read target data (S90). More specifically, the sense enable signal SE is activated to logical high, thereby making the transistors Tsen12 and Tsen34 into conductive states. The transistors Tsep12 and Tsep34 are conductive when the sense enable signal SE is deactivated to logical low. Therefore, the sense nodes SN and bSN are precharged with the power supply voltage VDD. At this time, the transistors TLCn1 and TLCn2 are conductive whereas the transistors TLCp1 and TLCp2 are nonconductive.

By activating the sense enable signal SE to logical high, the transistors Tsen12 and Tsen34 become conductive and the transistors Tsep12 and Tsep34 become nonconductive. The power supply voltage VDD is thereby disconnected from the sense nodes SN and bSN. The voltage of the sense node bSN changes to a voltage according to the conductive states of the first and second transistors T1 and T2. The voltage of the sense node SN changes to a voltage according to the conductive states of the third and fourth transistors T3 and T4.

That is, the read signal based on the read target data (the first voltage) is transmitted to the sense node bSN. The reference signal based on the intermediate data (the intermediate voltage between the second and third voltages) is transmitted to the sense node SN.

The latch circuit LC compares the voltage of the sense node bSN with that of the sense node SN, amplifies the voltage difference, and latches the voltage difference. The sense amplifier SA can thereby detect the read target data. Thereafter, from t6 to t7, the MRAM performs a data restoring operation as needed (S100). When the second sample data differs in logic from the read target data, the write bias circuit WBC needs to write back the data having the same logic as that of the read target data to the selected memory cell MC.

For example, at the time point of t6, the selected memory cell MC stores the data "1" as the second sample data. Therefore, if the read target data is the data "0", the write bias circuit WBC needs to write back the data "0" to the selected memory cell MC from t6 to t7. This data "0" write operation is the same as the data "0" write operation (first write operation) performed from t1 to t2. If the read target data is the data "1", there is no need to perform the data restoring operation.

In this way, according to the present embodiment, the signal holding circuit SSC holds the first voltage based on the read target data, the second voltage based on the data "0", and the third voltage based on the data "1". The signal holding circuit SSC applies the read signal to the sense amplifier SA based on the first voltage, and applies the reference signal to the sense amplifier SA based on the second and third voltages. The sense amplifier SA compares the read signal with the reference signal, thereby the sense amplifier SA detects the logic of the read target data stored in the selected memory cell MC.

It is possible to set each of the first and second sample data to have a logic opposite to the logic described above.

That is, the data "1" can be used as the first sample data and the data "0" can be used as the second sample data. In this case, the data restored from t6 to t7 has a logic opposite to the logic described above.

The MRAM according to the present embodiment generates the reference signal by using the data "0" that is actually stored in the selected memory cell MC and the data "1" that is actually stored in the selected memory cell MC. The reference signal is used to detect the read target data stored in the same selected memory cell MC. That is, according to the present embodiment, the sense amplifier SA detects the read target data by a self-referencing method. Therefore, the reference signal can be set to be closer to the center between the data "1" and the data "0", even if characteristics of the MTJ elements, those of the cell transistors CT, and those of the transistors that constitute the signal holding circuit SSC and the sense amplifiers SA are varied by process irregularities. The MRAM according to the present embodiment can detect fine signals obtained from the MTJ elements with high accuracy.

Figure 7A:
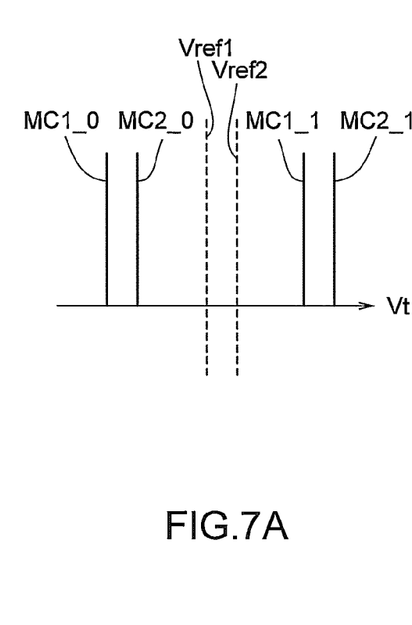
FIGS. 7A to 7C are graphs for explaining respective reference signals generated in the MRAM according to the present embodiment and MRAMs according to comparative examples.
Figure 7B:
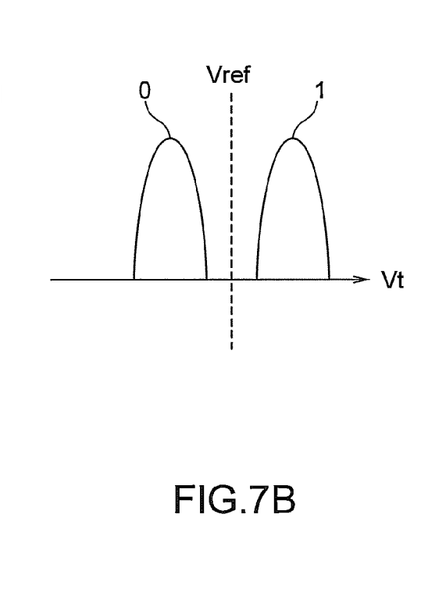
Figure 7C:
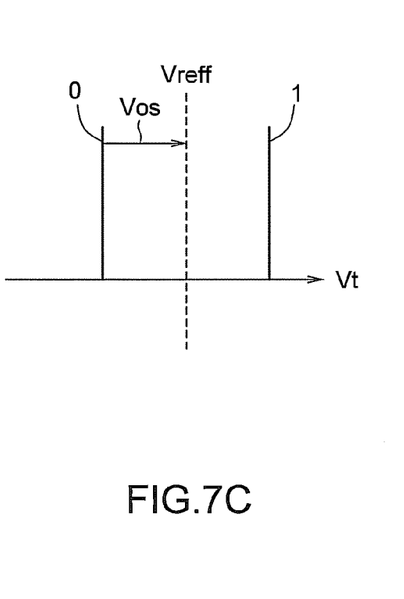

FIGS. 7A to 7C are graphs for explaining respective reference signals generated in the MRAM according to the present embodiment and MRAMs according to comparative examples of the present embodiment. FIG. 7A shows the reference signal generated in the MRAM according to the present embodiment. FIG. 7B shows the reference signal generated by using a reference cell as one of the comparative examples. FIG. 7C shows the reference signal generated by using the self-referencing method as the other comparative example.

In FIG. 7B, the reference signal is generated by using the reference cell different from the selected memory cell MC that actually stores therein the read target data. Therefore, the reference signal is preferably in between a signal distribution of the data "0" and that of the data "1". However, the signal distributions of the data "0" and the data "1" have spread to some extent according to normal distributions, respectively.

Therefore, a margin between a reference signal Vref and the data "0" and that between the reference signal Vref and the data "1" are narrow.

With the self-referencing method shown in FIG. 7C, the voltage based on the read target data read from the selected memory cell MC is held first. Sample data of a predetermined logic is then written to the selected memory cell MC, and the sample data is read again from the selected memory cell MC. Next, an offset voltage Vos is added to or subtracted from the sample data that is read second. The sense amplifier SA compares the reference signal obtained in this way with the read target data that is read first, thereby detecting the read target data.

However, the reference signal generated as shown in FIG. 7C is sensitive to the process irregularities similarly to the conventional techniques because the offset voltage Vos is set irrespectively of the characteristics of the actual MTJ elements, cell transistors CT, and the like.

On the other hand, in a case of the MRAM according to the present embodiment, information used to obtain the reference signal is all obtained from the actually selected memory cell MC. Accordingly, as shown in FIG. 7A, even if the characteristics of the selected memory cell MC, the cell transistor CT, and the like vary according to the processes, the reference signal changes according to the irregularities.

For example, it is assumed that a signal read from a selected memory cell MC1 that stores the data "0" is MC1_0, and that a signal read from the selected memory cell MC1 that stores the data "1" is MC1_1. In this case, the reference signal is Vref1 near a center between the MC1_0 and MC1_1. It is also assumed that a signal read from a selected memory cell MC2 that stores the data "0" is MC2_0, and that a signal read from the selected memory cell MC2 that stores the data "1" is MC2_1. In this case, the reference signal is Vref2 near a center between the MC2_0 and MC2_1. In this way, in the case of the MRAM according to the present embodiment, not only the read target data but also the reference signal Vref change according to the irregularities of the characteristics of the actually selected memory cell MC and peripheral elements of the selected memory cell MC. Therefore, in the MRAM according to the present embodiment, it is possible to obtain the reference signal from which the influence of the process irregularities is eliminated. As a result, the MRAM according to the present embodiment can read data with high accuracy even if the characteristics of the memory cells MC and the like have irregularities.

The MRAM according to the present embodiment needs to perform the three data read operations and the two data write operations so as to detect the target data stored in the selected memory cell MC. However, an operating speed of the MRAM is much higher than that of a NAND flash memory, for example. Furthermore, unlike the NAND flash memory, the MRAM has no limitation to the number of rewritable times. Therefore, it can be said that a read method according to the present embodiment is suitable for resistive random access memories such as the MRAM.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of resistance change storage elements;

a signal holding part configured to hold a plurality of voltages according to data stored in the storage elements; and a sense amplifier configured to detect the data stored in the storage elements based on the voltages held in the signal holding part, wherein the signal holding part holds a first voltage according to target data stored in a first storage element selected from among the storage elements, holds a second voltage according to first sample data of a first logic written to the first storage element, and holds a third voltage according to second sample data of a second logic written to the first storage element, the second logic being opposite to the first logic, and the sense amplifier compares a read signal based on the first voltage with a reference signal generated based on the second and the third voltages in order to detect a logic of the target data stored in the first storage element, wherein the signal holding part comprises:

a first and a second transistors connected to each other in parallel, a gate electrode of each of the and the second transistors receiving the first voltage; and a third and a fourth transistors connected to each other in parallel, gate electrodes of the third and the fourth transistors receiving the second voltage and the third voltages, respectively, the first and the second transistors apply the read signal to the sense amplifier, and the third and the fourth transistors apply the regerence signal to the sense amplifier.

2. The device of claim 1, wherein the signal holding part comprises:

a first transfer gate configured to transfer the first voltage to the gate electrode of the first transistor;

a second transfer gate configured to transfer the first voltage to the gate electrode of the second transistor;

a third transfer gate configured to transfer the second voltage to the gate electrode of the third transistor; and a fourth transistor configured to transfer the third voltage to the gate electrode of the fourth transistor.

3. The device of claim 1, wherein the reference signal is a signal obtained from the third and the fourth transistors by an intermediate voltage between the second voltage and the third voltage.

4. The device of claim 2, wherein the reference signal is a signal obtained from the third and the fourth transistors by an intermediate voltage between the second voltage and the third voltage.

5. The device of claim 1, wherein the storage elements are magnetic tunnel junction elements.

6. A driving method of a semiconductor storage device, the semiconductor storage device comprising: a plurality of resistance change storage elements; a signal holding part configured to hold a plurality of voltages according to data stored in the storage elements; and a sense amplifier configured to detect the data stored in the storage elements based on the voltages held in the signal holding part, the method comprising:

during a read operation for reading target data stored in a first storage element selected from among the storage elements, holding a first voltage according to the target data in the signal holding part;

writing first sample data of a first logic to the first storage element;

holding a second voltage according to the first sample data in the signal holding part;

writing second sample data of a second logic opposite to the first logic to the first storage element;

holding a third voltage according to the second sample data in the signal holding part; and comparing a read signal based on the first voltage with a reference signal generated based on the second and the third voltages in order to detect a logic of the target data stored in the first storage element, in the sense amplifier, wherein the signal holding part comprises:

a first and a second transistors connected to each other in parallel, a gate electrode of each of the first and the second transistiors receiving the first voltage; and a third and a fourth transistors connected to each other in paralle, gate electrodes of the third and the fourth transistors receiving the second voltage and the third voltages, respectively, the first voltage is held in the gate electrode of each of the first and the second transistors, the second voltage is held in the gate electrode of the third transistor, and the third voltage is held in the gate electrode of the fourth transistor.

7. The method of claim 6, wherein the first and the second transistors apply the read signal to the sense amplifier based on the first voltage, and the third and the fourth transistors apply the reference signal to the sense amplifier based on the second and the third voltages.

8. The method of claim 6, wherein the reference signal is a signal obtained from the third and the fourth transistors by an intermediate voltage between the second voltage and the third voltage.

9. The method of claim 7, wherein the reference signal is a signal obtained from the third and the fourth transistors by an intermediate voltage between the second voltage and the third voltage.

10. The method of claim 6, further comprising writing data of a logic identical to the logic of the target data to the first storage element, when the second logic of the second sample data differs from the logic of the target data.

11. The method of claim 6, further comprising writing data of a logic identical to the logic of the target data to the first storage element, when the second logic of the second sample data differs from the logic of the target data.

12. The method of claim 7, further comprising writing data of a logic identical to the logic of the target data to the first storage element, when the second logic of the second sample data differs from the logic of the target data.

13. The method of claim 8, further comprising writing data of a logic identical to the logic of the target data to the first storage element, when the second logic of the second sample data differs from the logic of the target data.

14. The method of claim 6, wherein the storage elements are magnetic tunnel junction elements.

* * * * *